United States Patent [19]

Peek et al.

[11] 4,318,086

[45] Mar. 2, 1982

[54] (B+A)-BIT-A/D CONVERTOR WITH B-BIT AUXILIARY A/D CONVERTOR

[75] Inventors: Johannes B. H. Peek; Wolfgang F. G. Mecklenbräuker; Theodoor A. C. M. Claasen; Nicolaas van Hurck, all of Eindhoven, Netherlands

[73] Assignee: U.S. Philips Corporation, New York, N.Y.

[21] Appl. No.: 88,736

[22] Filed: Oct. 26, 1979

[30] Foreign Application Priority Data

Nov. 30, 1978 [NL] Netherlands .......................... 7811731

[51] Int. Cl.³ .......................................... H03K 13/02
[52] U.S. Cl. ............................................ 340/347 AD
[58] Field of Search ............... 340/347 AD, 347 MT, 340/347 M; 375/34; 179/1 P; 332/11 D

[56] References Cited

U.S. PATENT DOCUMENTS

| | | | |
|---|---|---|---|
| 3,343,087 | 9/1967 | Helms | 375/34 |
| 3,716,849 | 2/1973 | Metcalf | 340/347 AD |
| 4,133,976 | 1/1979 | Atal | 179/1 P |

OTHER PUBLICATIONS

Candy "IEEE Transactions on Communications" vol. Com-24, No. 11, Nov. 1976, pp. 1268-1275.

*Primary Examiner*—Charles D. Miller
*Attorney, Agent, or Firm*—James J. Cannon, Jr.

[57] ABSTRACT

An analog-to-digital converter is described for converting an analog-signal into a sequence of (b+a)-bit code words by means of a b-bit auxiliary analog-to-digital converter. To reduce the quantizing noise resulting from the requisite quantizing of the analog signal samples this analog signal is applied to an integrating network whose output is connected to an amplitude-limiting device which brings the integrated signal within the signal range of the auxiliary analog-to-digital converter, which in its turn produces a sequence of b-bit code words which are applied to a digital output filter via a cascade arrangement of an amplitude-restoration device and a difference network.

Sampling pulses which occur at a frequency exceeding the Nyquist sampling frequency associated with the analog signal are applied to the auxiliary analog-to-digital converter.

6 Claims, 19 Drawing Figures

(B+A)-BIT-A/D CONVERTOR WITH B-BIT AUXILIARY A/D CONVERTOR

BACKGROUND OF THE INVENTION

(1) Field of the Invention

The invention relates to an analog-to-digital converter (A/D converter) for converting an analog signal into a digital signal consisting of a sequence of code words each comprising a plurality of bits.

(2) Description of the Prior Art

A/D converters are used in widely divergent technical fields. Embodiments of A/D converters are described in reference 1, (see paragraph D). In general, they convert a time-continuous signal into a time and amplitude-discrete signal. For this conversion an analog signal is sampled with a certain sampling frequency. Each of the samples thus obtained is encoded within a certain period of time, the so-called conversion time. Encoding of a signal sample means that a code word or number is generated comprising a number of symbols or bits. In order that the required number of bits does not exceed a predetermined number, the sample is first quantized, that is to say that the value of this sample is made equal to an integral number of times a pre-determined elementary voltage or current. This elementary voltage or current is denoted quantization step size. The code word now indicates how many times the quantization step size is included in the quantized sample. The number of bits of each of these code words is determined by the distance between the highest positive and the lowest negative value of the analog signal to be coded, and by the desired quantization step size. In its turn this quantization step size determines the quantizing noise introduced by the quantizing process. As known, this quantizing noise is directly proportional to the quantization step size and will have to be below a predetermined threshold. The height of this threshold is determined when the type of signal to be coded is known. For example, when coding speech signals, a greater amount of quantizing noise will be tolerated than when coding music signals which must be of Hi-Fi quality after decoding.

In practice, the quantizing noise is not used as an absolute quantity but it is considered relatively with respect to the signal, more particularly the ratio between the signal and the quantizing noise is considered in practice and this ratio is expressed in decibels (dB). Hereinafter this ratio will be denoted by SNR and, as known, is approximately equal to $$SNR = (6n - 2) dB \qquad (1)$$

for a sinusoidal signal. Herein n represents the number of bits of each of the code words.

It follows from (1) that when a higher value of SNR is desired the number of bits n of each of the code words must be increased. As more quantizing noise can be allowed for coding a speech signal than for coding a music signal, twelve-bit code words are usually taken in practice for coding a speech signal but for the coding of a music signal at least 14-bit code words are required.

The more bits a code word must have, the greater the accuracy and stability must be of the components with which the A/D converter is implemented and, consequently, the higher its price. This price is a barrier for the use of these A/D converters in, for example, audio equipment such as, for example, magnetophons for the consumer market.

Hereinafter a code word comprising, for example, d bits will be denoted "d-bit code word". Similarly, an A/D converter arranged for converting an analog signal into d-bit code words will be denoted "d-bit A/D converter".

SUMMARY OF THE INVENTION

It is an object of the invention to provide an A/D converter which can be realised in an economically justified manner.

According to the invention, the A/D converter for converting an analog signal whose frequency spectrum is located in a certain signal frequency band into a sequence of (b+a)-bit code words comprises:

a. an input for receiving said analog signal;

b. integrating and amplitude-limiting means for producing an auxiliary signal which is an amplitude-limited version of the integrated signal applied to these means;

c. means for coupling the input of the integrating and amplitude-limiting means to said analog signal input;

d. an auxiliary analog-to-digital converter to which said auxiliary signal is applied and which is arranged for converting this auxiliary signal into a sequence of code words each comprising b bits; sampling pulses occurring with a sampling frequency greater than the Nyquist sampling frequency of the analog signal being applied to this auxiliary analog-to-digital converter;

e. a cascade arrangement of a digital difference network and of digital amplitude-restoring means, connected to the output of the auxiliary analog-to-digital converter;

f. a digital filter coupled to the output of the cascade arrangement and arranged for suppressing the components located outside the signal frequency band and for producing said (b+a)-bit code words.

By means of the analog-to-digital converter, according to the invention, a (b+a)-bit A/D conversion is realized, use being made for this purpose of a b-bit auxiliary A/D converter which is, in general, cheaper and simpler. In order to obtain yet a signal-to quantizing noise ratio associated with a(b+a)-bit A/D converter the analog input signal is preprocessed before it is applied to the A/D converter. Thereafter the output signal of the auxiliary A/D converter is subjected to a post-processing operation. This post-processing operation shifts the quantizing noise signal introduced by the A/D converter to such a frequency band that it can be suppressed by the digital filter. The pre-processing operation has for its purpose to enable the above-mentioned suppression of the noise signal without affecting the desired signal.

REFERENCES

1. Special Issue on Analog/Digital Conversion; IEEE Transactions on Circuits and Systems, Vol. CAS-25, No. 7, July 1978.

2. Digital Signal Processing; A. V. Oppenheim, R. W. Schafer; Prentice-Hall 1975; pages 413-418.

3. Dutch patent Application 7703633.

4. Optimum FIR Digital Filter Implementations for Decimation, Interpolation, and Narrow Band Filtering; L. R. Rabiner, R. E. Crochiere; IEEE Transactions on Acoustics, Speech and Signal Processing, Vol. ASSP-23, October 1975, pages 444-456.

5. Further Considerations in the Design of Decimators and Interpolators; R. E. Crochiere, L. R. Rabiner; IEEE Transactions on Acoustics, Speech, and Signal Processing Vol. ASSP-24, August 1976, pages 296-311.

6. Computation Rate and Storage Estimation in Multirate Digital Filtering with Half-Band Filters; M. G. Bellanger; IEEE Transactions on Acoustics, Speech and Signal Processing, Vol. ASSP-25, August 1977, pages 344-346.

DESCRIPTION OF THE PREFERRED EMBODIMENTS

(1) Introduction

(1.1) The power spectrum of the digital signal

Figure 1:
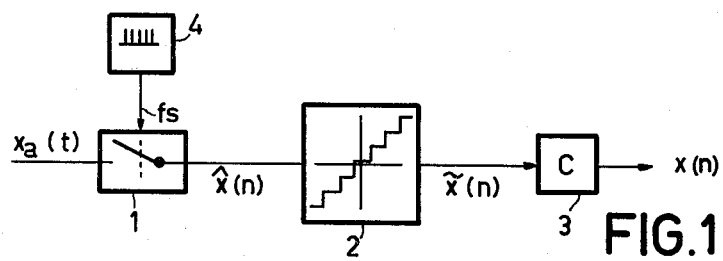
FIG. 1 shows schematically the construction of an A/D converter.

In the preceding it was stated that to enable the conversion of an analog signal into a digital signal, this analog signal must first be sampled; that the signal samples thus obtained must be quantized and, finally, the quantized signal samples must be expressed in a number (preferably represented in base-2-code). As shown schematically in FIG. 1, an A/D converter generally comprises for this purpose a sampling device 1, a quantizing device 2 and a coding device 3. Sample pulses occurring with a pre-determined frequency $f_s$, the so-called sampling frequency, are applied to the sampling device 1. These sampling pulses are produced by clock pulse generator 4. The coding device 3 now supplies the above-mentioned digital numbers and these numbers all comprise the same number of bits. Assuming that the A/D converter shown in FIG. 1 is a b-bit A/D converter, each of the numbers produced by the coding device 3 comprises b bits having the values $c_0, c_1, c_2, c_3 \ldots c_{b-1}$, respectively, $c_i$ being equal to 0 or 1.

It is now assumed that the input signal of this A/D converter may vary between the quantities $-V_{max}$ and $+V_{max}$, then the above digital number represents a voltage or current having the value:

$$(-1)^{c_0}(c_1 2^{-1} + c_2 2^{-2} + c_3 2^{-3} + \ldots + c_{b-1} 2^{-b+1})V_{max} \quad (2)$$

The quantity $2^{-b+1}V_{max}$ is called the quantizing step size and will be denoted by q, so that it holds that $$q = 2^{-b+1}V_{max} \quad (3)$$

Figure 2:
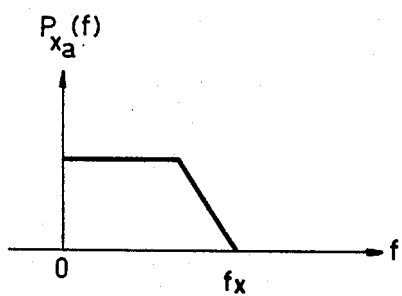
FIG. 2 shows schematically the power spectrum of an analog signal.

The influence of each of the processes "sampling" and "quantizing" on the power spectrum of the original analog signal will be described in this introduction. The starting point is a real analog signal which is applied to the b-bit A/D converter shown schematically in FIG. 1. This analog signal will be denoted by $x_a(t)$, it being assumed that its frequency spectrum will only differ from zero at the frequency interval $0 \leq f \leq f_x$. The power spectrum of this signal $x_a(t)$ will be denoted by $P_{x_a}(f)$ and is schematically shown in FIG. 2.

Figure 3:
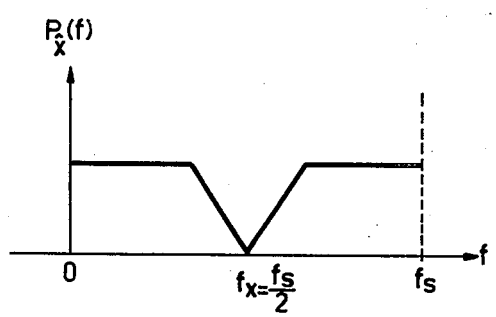
FIG. 3 shows one period of the power spectrum of a time-discrete and amplitude-continuous signal.

If now this signal $x_a(t)$ is applied to the sampling device 1, which takes samples from $x_a(t)$ at a sampling frequency $f_s = 2f_x$, a set of samples which will be denoted by $x(n)$ and for which it holds that:

$$\hat{x}(n) = x_a(nT) \text{ where } -\infty < n < \infty \quad (4)$$
$$n = \text{integral}$$
$$\text{and } T = 1/f_s$$

is produced at the output of the sampling device. The power spectrum of this time-discrete signal will be denoted by $P_{\hat{x}}(f)$. FIG. 3 shows a period of this power spectrum.

Thereafter, the signal samples $\hat{x}(n)$ are applied to the quantizing device 2 which performs a non-linear quantizing operation $Q[.]$ on these signal samples $x_a(nT)$, which results in quantized signal samples which will be denoted by $\bar{x}(n)$ and for which it holds that:

$$\bar{x}(n) = Q[x_a(nT)] = x(n)V_{max} \quad (5)$$

In (5) x(n) represents a b-bit number. In response to the quantized signal samples $\bar{x}(n)$ which are applied to the coding device, the coding device produces the above-mentioned b-bit numbers x(n).

If the amplitude of $x_a(t)$ is limited, the quantizing operation can also be written in a different manner, it being possible to express each quantized signal sample x(n) as follows:

$$\bar{x}(n) = x_d(nT) + e(n) \tag{6}$$

In this expression e(n) represents the quantizing error it holding for the error that:

$$-q/2 < e(n) < +q/2 \tag{7}$$

These quantizing errors e(n) may be considered as samples of a noise signal having a power density spectrum distributed uniformly over the frequency interval $0 \leq f \leq 2f_x$. Consequently, this noise signal may be considered as "white noise" (see reference 2). If now the total noise power of this noise signal is denoted by $P_e$ and its power spectrum by $P_e(f)$, then it holds that:

$$P_e = q^2/12 \tag{8}$$

$$P_e(f) = q^2T/12 \tag{9}$$

Figure 4:
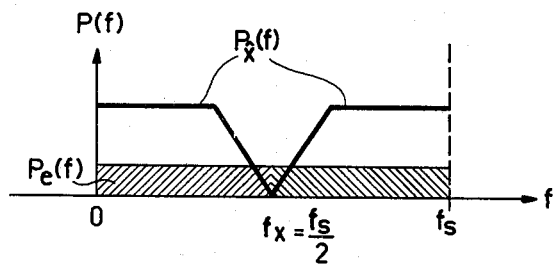
FIG. 4 shows one period of the power spectrum of a time and amplitude-discrete signal and the noise signal power spectrum introduced by the fact that the amplitude is discrete.

FIG. 4 shows schematically the power spectrum of x(n). More particularly, FIG. 4 shows that this power spectrum is formed by the sum of the power spectrum of $\hat{x}(n)$ and the power spectrum of e(n). If now the total power of $\hat{x}(n)$ is represented by $P_{\hat{x}}$, then the signal-to-noise ratio for the signal x(n) is equal to:

$$P_{\hat{x}}^*/P_e = 12P_{\hat{x}}^*/q^2 \tag{10}$$

From (10) it follows that the signal-to-noise ratio can only be increased by choosing a lower value of q. The value of $V_{max}$ remaining equal, a smaller value of q requires a larger number of bits for the numbers x(n). Assuming that the quantizing step size is reduced to a value $q_1 = q/2^a$ then the A/D converter will have to produce (b+a)-bit numbers x(n). The digital output signal of this (b+a)-bit A/D converter will now have a signal-to-noise ratio which is equal to:

$$12P_{\hat{x}}^* 2^{2a}/q^2 \tag{11}$$

which is $2^{2a}$ times as high as the signal-to-noise ratio expressed in (10).

(1.2) The sampling frequency and the signal-to-noise ratio

Paragraph (1.1) indicates that the samples e(n) will be considered as the samples of a noise signal having a noise power which is uniformly distributed over the frequency interval $0 \leq f \leq f_s$. For the b-bit A/D converter described in paragraph E(1.1) it was assumed that $f_s = 2f_x$, so that a noise signal having a noise power equal to $q^2/24$ is present in both the frequency interval $0 \leq f \leq f_x$ and the frequency interval $f_x \leq f \leq 2f_x$.

Figure 5:
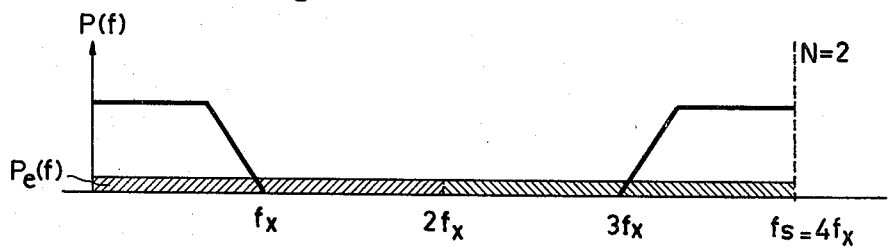
FIG. 5 shows one period of the output signal of the A/D converter of FIG. 1 if the analog signal shown in FIG. 2 is applied to it and the sampling frequency $f_s$ is equal to $2Nf_x$, where $N=2$.

By choosing, in this b-bit A/D converter the sampling frequency $f_s$ higher than $2f_x$, for example N-times higher so that $f_s = 2Nf_x$, the noise power is distributed over a frequency interval which is N times greater. As the total noise power remains equal to $q^2/12$, a noise power equal to $q^2/(24N)$ is now present in both the frequency interval $0 \leq f \leq f_x$ and the interval $(2N-1)f_x \leq f \leq 2Nf_x$. FIG. 5 shows schematically the power spectrum of the digital output signal of this A/D converter for N=2.

The frequency components located in the frequency interval $f_x \leq f \leq (2N-1)f_x$ can now be suppressed by means of a digital low-pass filter. Thereafter, the sampling frequency can be reduced by a factor of N, so that the components of the digital signal are produced again with the sampling frequency $2f_x$.

Figure 6:
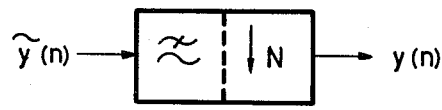
FIG. 6 shows the symbol of a decimator.

Reducing the sampling frequency by a factor of N can be achieved by means of an arrangement which passes only each Nth number produced by the digital low-pass filter and suppresses all other numbers. Such an arrangement is described in reference 3, where it is called SRR-element. The cascade arrangement of said digital low-pass filter and the SSR-element is sometimes called decimator and will be indicated by means of the symbol shown in FIG. 6. In this symbol, N represents the reduction factor. Embodiments of such a decimator are described in, for example, the references 4, 5 and 6.

Figure 7:
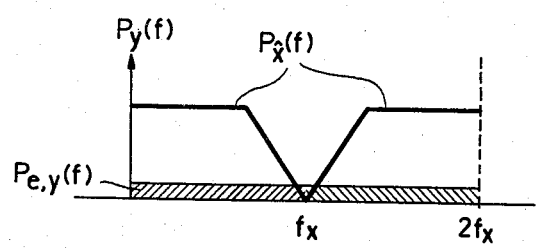
FIG. 7 shows one period of the power spectrum of the output signal of the decimator shown in FIG. 6 if a signal having the power spectrum shown in FIG. 5 is applied to it.

If now a signal $\bar{y}(n)$ is applied to the decimator with the power spectrum shown in FIG. 5, this decimator produces an output signal y(n) having a power spectrum $P_y(f)$ whose shape is schematically shown in FIG. 7.

The total noise power in the frequency interval $0 \leq f \leq 2f_x$ is now equal to $P_{e,y}$ where:

$$P_{e,y} = q^2/(12N) \tag{12}$$

and the signal-to-noise ratio of the signal y(n) is equal to:

$$P_{\hat{x}}^*/P_{e,y} = P_{\hat{x}}/(q^2/12N) = 12NP_{\hat{x}}^*/q^2 \tag{13}$$

Now this expression can be made equal to expression (11) namely by choosing N equal to $2^{2a}$, so that it holds, for example, for a=4 that N=256. To achieve a considerable improvement in the signal-to-noise ratio a very high sampling frequency will generally be required.

The reason that the increase in the sampling frequency actually results in only little improvement in the signal-to-noise ratio is that it only distributes the noise power over a larger frequency interval. An improved distribution of the noise power would result in a further improvement of the signal-to-noise ratio but then this distribution must be such that there is less noise power in those frequency intervals which are occupied by the desired signal and more in the other frequency intervals. This means for the signal whose power spectrum is shown in FIG. 5 that there must be less noise power in the frequency intervals $0 \leq f \leq f_x$ and $3f_x \leq f \leq 4f_x$ and more noise power in the frequency interval $f_x \leq f \leq 3f_x$. In that case the noise signal can no longer be considered as white noise and consecutive noise signal samples e(n) will be correlated.

A noise power having the properties meant above is obtained by means of a delta modulator and also by means of a differential pulse code modulator. Such A/D converters have a feedback loop which ensures that the consecutive noise signal samples are highly correlated, causing the major portion of the noise power to become located at frequencies around $f_s/2$. The drawback of a feedback circuit is, inter alia, the fact that an accurate D/A converter is required in the loop (see, for example, reference 1, pages 448–460).

(2). The arrangement according to the invention, general structure

Figure 8:
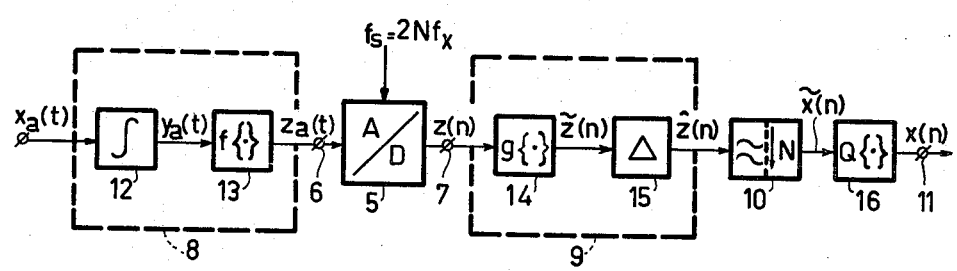
FIG. 8 shows schematically the general structure of the analog-to-digital converter according to the invention.

This paragraph gives a description of the general structure, shown in FIG. 8, of an arrangement for converting an analog signal $x_a(t)$ into a digital signal x(n) which seems to have been generated by a (b+a)-bit A/D converter, while this arrangement utilises to that end a b-bit A/D converter which is not included in a feedback loop.

The arrangement shown in FIG. 8 comprises a b-bit A/D converter 5 of a conventional construction. Sampling pulses are supplied to this A/D converter with a sampling frequency $f_s = 2Nf_x$. This A/D converter comprises an analog signal input 6 and a digital signal output 7. If now, as shown in the Figure, an analog signal $z_a(t)$ is applied to this b-bit A/D converter via the input 6, then there is produced at the output thereof a digital signal formed by the b-bit numbers z(n) occurring with a frequency $2Nf_x$.

The input 6 of this A/D converter 5 is connected to the output of a pre-processing arrangement 8, to which the analog signal $x_a(t)$, whose power spectrum is shown in FIG. 2, is applied. The output 7 of the A/D converter 5 is connected to the input of a post-processing arrangement 9, which has its output connected to the input of a decimator 10 having a reduction factor of N. The output of this decimator is coupled to the output 11 of the arrangement. The desired (b+a)-bit numbers x(n) are now produced at this output 11 with a sampling frequency $2f_x$.

The pre-processing arrangement 8 comprises an integrating network 12 and an amplitude-limiting arrangement 13 having a predetermined fixed limiting function f{.}. The integrating network 12 produces in response to the signal $x_a(t)$ applied thereto a signal $y_a(t)$ for which it holds that:

$$y_a(t) = K \int_0^t x_a(\tau)d\tau \qquad (14)$$

In (14) K denotes any arbitrary constant. The signal $y_a(t)$ is applied to the limiting arrangement 13, which produces the output signal $z_a(t)$ for which it holds that:

$$z_a(t) = f\{y_a(t)\} \qquad (15)$$

This signal $z_a(t)$ is now applied to the b-bit A/D converter 5 which produces the numbers $\bar{z}(n)$. In accordance with (5) and (6) it now holds that:

$$z(n)V_{max} = z_a(nT) + e(n); \quad T = 1/(2Nf_x) \qquad (16)$$

The post-processing arrangement 9 comprises an amplitude-restoring arrangement 14 and a difference network 15. The restoring arrangement 14 produces, in response to the numbers $\bar{z}(n)$ applied thereto, the numbers z(n) for which it holds that:

$$\bar{z}(n)V_{max} = g\{z(n)V_{max}\} = g\{z_a(nT) + e(n)\} \qquad (17)$$

In (17) g{.} denotes the restoration function. For an accurate amplitude restoration g{.} must be the inverse function of the function f{.}. This means that in general it must hold for a variable $\alpha$ that:

$$\alpha = g\{f(\alpha)\} \qquad (18)$$

From (15) and (17) it now follows that:

$$\bar{z}(n)V_{max} = g\{f(y_a(nT))\} + r(n) \qquad (19)$$
$$\bar{z}(n)V_{max} = y_a(nT) + r(n) \qquad (20)$$

This digital signal $\bar{z}(n)$ is now applied to the difference network 15 which is assumed to be of the first order. This difference network 15 produces the output signal $\tilde{z}(n)$ for which it holds that:

$$\tilde{z}(n) = \bar{z}(n) - \bar{z}(n-1) \qquad (21)$$

so that $$\tilde{z}(n)V_{max} = y_a(nT) - y_a[(n-1)T] + r(n) - r(n-1).$$

with (14) it follows herefrom that:

$$\tilde{z}(n)V_{max} = K \int_{(n-1)T}^{nT} x_a(\tau)d\tau + r(n) - r(n-1) \qquad (22)$$

Since K is any random constant it can be chosen equal to 1/T, so that the first term in (22) becomes approximately equal to $x_a(nT - T/2)$ and (22) thus changes into:

$$\tilde{z}(n)V_{max} \approx x_a(nT - T/2) + r(n) - r(n-1) \qquad (23)$$

Each of the numbers $\tilde{z}(n)$ comprise, which also applies to the numbers z(n), b bits and are applied to the decimator 10 producing the numbers $\hat{x}(n)$. As customary, the numbers $\tilde{z}(n)$ are multiplied in this decimator 10 by filter coefficients which also comprise a predetermined number of bits, for example $a_1 = a + a_0$ bits. The numbers $\bar{x}(n)$ produced by this decimator now contain $b + a_1 = b + a + a_0$ bits of which only $b + a$ bits are relevant. Only these $b + a$ bits of each of the numbers $\bar{x}(n)$ are applied to the output 11 of the arrangement. Discarding the $a_0$ least-significant bits of the numbers x(n) is achieved by, for example, rounding the numbers x(n) and this process is symbolically shown in FIG. 8 by the discarding arrangement 16 to which the $(b + a + a_0)$-bit numbers $\bar{x}(n)$ are applied and which produce the $(b + a)$-bit numbers $\bar{x}(n)$.

That a shift of a noise power to frequencies located outside the signal band is indeed realized by means of the arrangement shown in FIG. 8 can be explained as follows.

If the noise signal in $\tilde{z}(n)$ is represented by s(n), then it holds in accordance with (22) that:

$$s(n) = r(n) - r(n-1) \qquad (24)$$

If the power spectrum of r(n) is represented by $P_r(f)$ and that of s(n) by $P_s(f)$ then it can be derived that:

$$P_s(f) = 4P_r(f)\sin^2(2\pi fT/2) \qquad (25)$$

Figure 9:
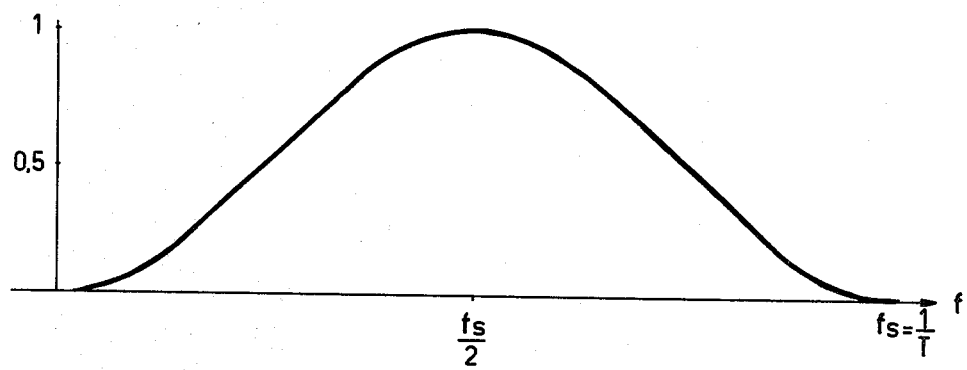
FIG. 9 shows the variation of the function $\sin^2(2fT/2)$ occurring in expression (25)

FIG. 9 shows the variation of the function $\sin^2(2\pi fT/2)$. If $P_r(f)$ is finite for all values of f, then it appears from FIG. 9 that the noise originally present in the signal band is suppressed.

If it is now assumed that the filter in the decimator performs a function corresponding with that of an ideal low-pass filter having a cut-off frequency $1/(2NT)$ and if the total power of the noise signal located in the signal band is represented by $P_e'$ then it holds that:

$$P_e' = 2 \int_0^{1/(2NT)} 4P_r(f)\sin^2(2\pi fT/2)df \qquad (26)$$

If it is now assumed for simplicity that the function g{.} is a linear function, then it holds that $$r(n) = g\{e(n)\} = ke(n) \quad (27)$$

wherein K is a constant. The total noise power of $e(n)$ is expressed in (8) and the noise spectrum of $e(n)$ is shown in (9). From this it follows that:

$$P_r(f) = kP_e(f) = kT\frac{q^2}{12} \quad (28)$$

By means of (28) (26) passes into:

$$P_e' = \frac{2}{3}kTq^2 \int_0^{1/(2NT)} \sin^2(2\pi fT/2)df \quad (29)$$

$$P_e' = \frac{kq^2}{6\pi}\left(\frac{\pi}{N} - \sin\frac{\pi}{N}\right)$$

Now it should hold that the noise power defined in (29) is equal to the noise power produced by an A/D converter wherein a quantizing step size $q.2^{-a}$ is used, the sampling frequency being equal to $2f_x$, and which produces (b+a)-bit numbers. If last-mentioned noise power is represented by $P_e$, then it holds therefore that:

$$P_e = q^2 \cdot 2^{-2a}/12 \quad (30)$$

and for $P_e'$ defined in (29) it should hold that:

$$P_e' = P_e \quad (31)$$

For a desired value of a the associated value of N follows from (29), (30) and (31); it namely holds that:

$$a = \frac{1}{2}\log_2\left[\frac{2k}{N}\left(1 - \frac{N}{\pi}\sin\frac{\pi}{N}\right)\right] \quad (32)$$

Figure 10:
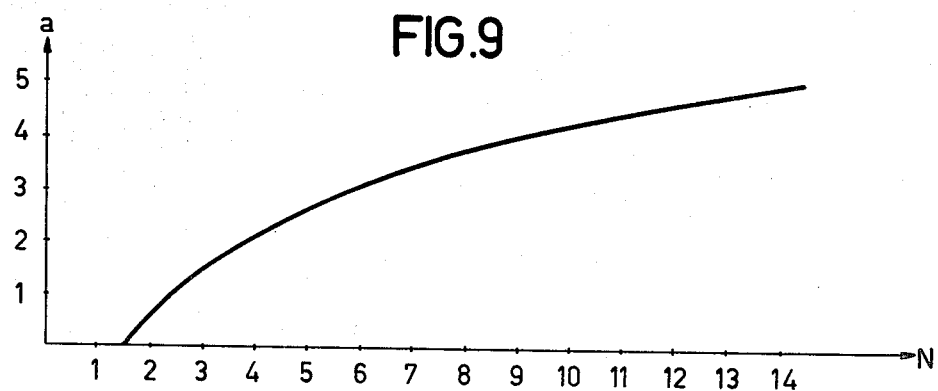
FIG. 10 shows the relation, defined in expression (32) between the number of additional bits $a$ and the increase factor N of the sampling frequency.

This function defined in (32) is shown for k=1 in FIG. 10. From this FIG. 10 it appears that, if, for example, a=4 than then N is to be chosen to be 9.2.

(3) The amplitude-limiting and restoration functions

In the preceeding only one special requirement was imposed on the amplitude-limiting function. This function is namely assumed to be invertable because otherwise no amplitude-restoration function can be found. That, however, not every invertable function can be utilized as an amplitude-limiting function may be apparent from the following example. Assume:

$$z_a(t) = \arctan y_a(t) \quad (33)$$

For an accurate restoration of the amplitude it must now hold that:

$$z(n)V_{max} = \tan\{z_a(nT) + e(n)\} \quad (34)$$

It follows from (33) and (34) that if $e(n)=0$ it indeed holds, as intended, that:

$$z(n)V_{max} = \tan\{\arctan y_a(nT)\} = y_a(nT).$$

As, however, $e(n)$ is in general unequal to zero, this relation is seriously disturbed.

A very advantageous amplitude-limiting function is obtained by periodically repeating a function defined in a given interval and being a monotonously varying and invertable function in this interval, it being necessary that this interval and, consequently, also said period is suitably chosen. In what follows hereinafter this period will be indicated by R and it will be assumed that it satisfies the relation:

$$R = k'V_{max} \quad (35)$$

Herein k' denotes a number which can be represented by means of a finite number of bits. A possible amplitude-limiting function is now given by:

$$z_a(t) = F\{\pi[y_a(t) - kR]\} \quad (36)$$

so that $$z_a(nT) = F\{\rho[y_a(nT) - k_nR]\} \quad (37)$$

In (36) and (37) $\rho$ represents a random number, while it must again hold that:

$$-V_{max} \leq z_a(t) \leq +V_{max} \quad (38)$$

This relation (38) fixes the value of R.

As the numbers occurring at the output of the restoration arrangement 14 must satisfy (20) it can be derived that it must hold for the amplitude-restoration function that:

$$\hat{z}(n)V_{max} = \frac{1}{\eta}G\{z(n)V_{max}\} + k_nR \quad (39)$$

or:

$$\hat{z}(n) = \frac{1}{\eta}\frac{1}{V_{max}}G\{z(n)V_{max}\} + k_nk'$$

$$= \frac{1}{\eta}G'\{z(n)\} + k_nk'$$

where: $G\{F(\xi)\} = \xi$

By now assuming that:

$$\frac{1}{\eta}G'\{z(n)\} = z'(n)$$

(39) passes into:

$$\hat{z}(n) = z'(n) + k_nk'$$

In its generality it follows from (21) that:

$$\hat{z}(n) = z'(n) - z'(n-1) + (k_n - k_{n-1})k' \quad (40)$$

As the amplitude of the input signal $x_a(t)$ is limited, also the amplitude of each number $\hat{z}(n)$ is limited in accordance with (23). This means that although $k_n$ and $k_{n-1}$ are each unlimited, the difference $k_n - k_{n-1}$ represents a finite number.

Because further $\hat{z}(n)V_{max}$ can never exceed $V_{max}$, it holds, if the period R is chosen larger than or equal to $V_{max}$ that then:

$$\text{either } k_n - k_{n-1} = 0 \quad (41)$$
$$\text{or } k_n - k_{n-1} = -1$$
$$\text{or } k_n - k_{n-1} = +1$$

As shown in (41), $k_n - k_{n-1}$ can assume one out of three possible values. This is connected with the fact that $y_a(nT)$ can be both greater and smaller than $y_a[(n-1)T]$. Should, however, $x_a(t)$ always be positive, then $y_a(t)$ would increase monotonously. In that case $k_n-k_{n-1}$ can only be 0 or +1. If it is assumed that:

$$0<x_a(t)<2V_{max} \tag{42}$$

and that $$R \geq 2V_{max} \tag{43}$$

it then holds that:

if not: $z_a(nT) > z_a[(n-1)T]$ then $k_n - k_{n-1} = 0$
if: $z_a(nT) < z_a[(n-1)T]$ then $k_n - k_{n-1} = 1$  (44)

In addition, the foregoing means that $z(n)$ can be fully determined from the difference $z'(n)-z'(n-1)$. If, namely $$z'(n) - z'(n - 1) > 0 \tag{45}$$
then
$k_n - k_{n-1} = 0$
and
$\hat{z}(n) = z'(n) - z'(n - 1)$
If, on the contrary:
$$z'(n) - z'(n - 1) < 0 \tag{46}$$
then
$k_n - k_{n-1} = 1$
and
$\hat{z}(n) = z'(n) - z'(n - 1) + k'$

(4) Special embodiments

Figure 11:
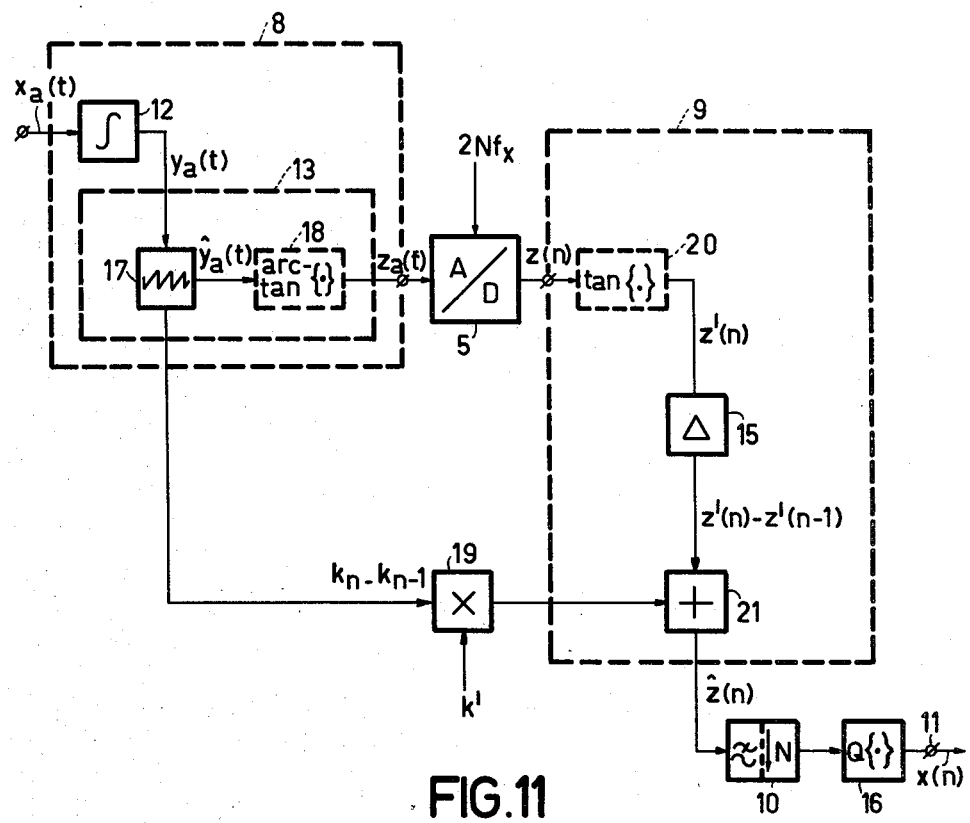
FIG. 11 shows schematically a modification of the analog-to-digital converter shown in FIG. 8.

FIG. 11 shows schematically a modification of the arrangement shown in FIG. 8, wherein the amplitude-limiting function defined by the expression (36) is now more particularly given by:

$$z_a(t) = \text{arc tan }\{y_a(t) - kR\} \tag{47}$$

and wherein the amplitude-restoration function defined by the expression (39) is now given by:

$$\hat{z}(n) = \tan\{z(n)\} + k_n k' \tag{48}$$

It should be noted that the constant $\rho$ present in the expressions (36) and (39) is now chosen equal to unity. For the period R a value must now be chosen such that (38) it satisfied so that it must hold that:

$$-\tan V_{max} \leq y_a(t) - kR \leq +\tan V_{max} \tag{49}$$

This is satisfied by:

$$R = 2 \tan V_{max} \tag{50}$$

Figure 12:
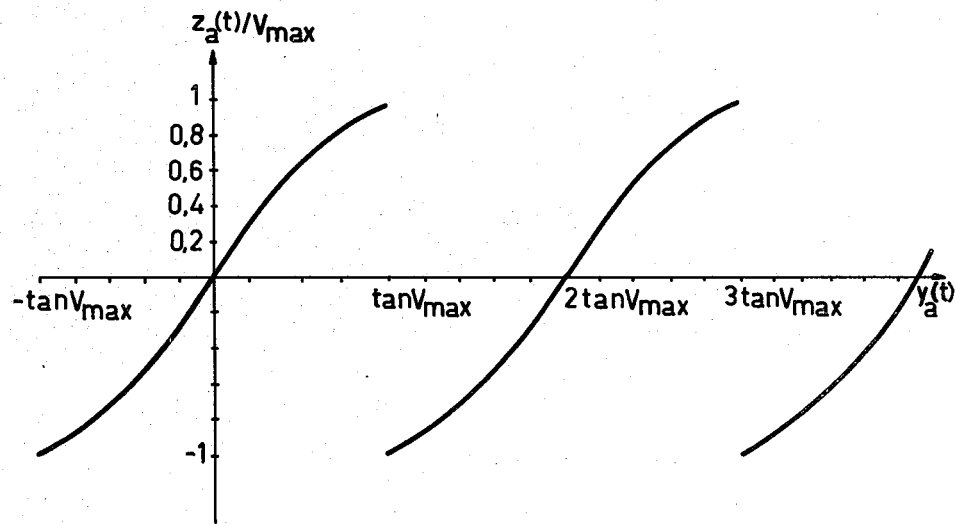
FIG. 12 shows, by means of a graph, the variation of a periodical amplitude-limiting function which is non-linear in each period.

The relation, defined in expression (47) between $z_a(t)$ and $y_a(t)$ is shown graphically in FIG. 12. More particularly, FIG. 12 shows the relation between $z_a(t)/V_{max}$ and $y_a(t)$ and the period R satisfies the expression (50).

It follows now from (40) and (48) that:

$$\hat{z}(n) = \tan z(n) - \tan z(n-1) + (k_n - k_{n-1})k' \tag{51}$$

As $\tan V_{max}$ exceeds $V_{max}$ the expression (41) holds for $k_n - k_{n-1}$.

The arrangement shown in FIG. 11 is implemented to a very high degree in the same manner as the arrangement shown in FIG. 8. In this FIG. 11 elements corresponding to elements shown in FIG. 8 are given the same reference numerals as in FIG. 8.

As shown in FIG. 11, the amplitude-limiting arrangement 13 is now formed by a cascade arrangement of two auxiliary amplitude-limiters 17 and 18. The auxiliary limiter 17 produces a residual signal $\hat{y}_a(t)$ as well as the number $k_n-k_{n-1}$. For the relation between the input signal $y_a(t)$ and the output signal $y_a(t)$ of this auxiliary-limitor 17 it holds that:

$$\hat{y}_a(t) = y_a(t) - kR = y_a(t) - 2k \tan V_{max} \tag{52}$$

This signal $y_a(t)$ is applied to the auxiliary limiter 18 which produces the signal $z_a(t)$ for which it holds that:

$$z_a(t) = \arctan \hat{y}_a(t) \tag{53}$$

The number $k_n-k_{n-1}$ produced by the auxiliary limiter 17 is applied to a constant factor multiplier 19 to which also the number k' is applied and which thus produces the number $(k_n-k_{n-1})k'$.

For calculating the numbers $\hat{z}(n)$ defined in expression (51), the amplitude-restoration arrangement indicated by the reference 14 in FIG. 8 is now formed by a cascade arrangement of an auxiliary amplitude restorer 20 and an adder 21. The difference network 15 is now arranged between the output of the auxiliary restorer 20 and the input of the adder 21. The numbers $z(n)$ produced by the auxiliary-A/D converter 5 are now applied to the auxiliary restorer 20, which in response thereto produces the numbers $z'(n)$ for which it holds that:

$$z'(n) = \tan z(n) \tag{54}$$

These numbers $z'(n)$ are applied to the difference network 15, which in response thereto produces numbers which are equal to the difference $z'(n)-z'(n-1)$, the latter numbers being applied to the adder 21 to which also the number $(k_n-k_{n-1})k'$ is applied. The numbers $\hat{z}(n)$, defined in (51) and which are further processed in the same manner as in the arrangement shown in FIG. 8 are now produced at the output of this adder 21.

The limiting arrangement 13 in the embodiment shown in FIG. 11 is thus formed by means of two auxiliary limiters 17 and 18 and the restoration arrangement is thus formed by means of a cascade arrangement of an auxiliary restorer 20 and an adder 21. The auxiliary limiter 17 can indeed be implemented (see paragraph E(5)) in a simple and economic manner, but the implementation of the auxiliary limiter 18 and the auxiliary restorer 20 is not always simple and economically feasible. The auxiliary restorer 20 and the auxiliary limiter 18 can, however, be formed by a direct through-connection, namely if the limiting function defined by the expression (36) is given by:

$$z_a(t) = \rho[\hat{y}_a(t) - kR] \tag{55}$$

For $\rho = 1$ R can be taken equal to $2V_{max}$, so that:

$$z_a(t) = y_a(t) = \hat{y}_a(t) - 2kV_{max} \tag{56}$$

Figure 13:
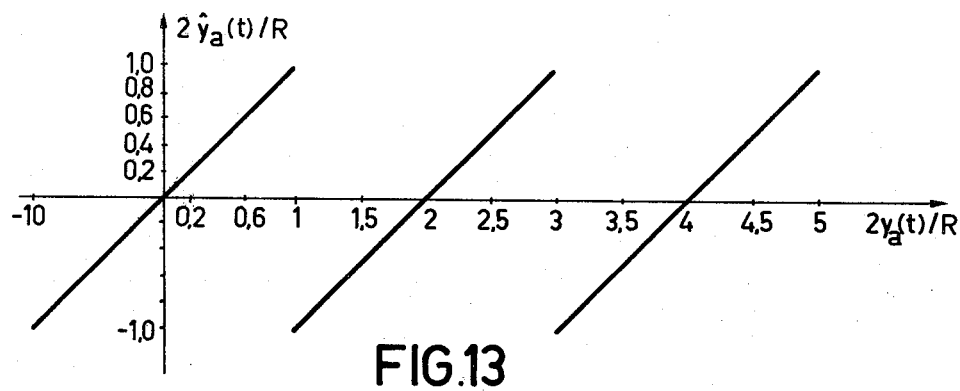
FIG. 13 shows by means of a graph the variation of a periodical amplitude-limiting function which is linear in each period.

The relation, given in (56), between $z_a(t)$ and $y_a(t)$ is shown graphically in FIG. 13. Since expression (56) has the same form as expression (52), FIG. 13 is more generally a graphical representation of the relation between $\hat{y}_a(t)/(R/2)$ and $y_a(t)/(R/2)$.

A restoration function which must be formed as follows:

$$\hat{z}(n) = z(n) + k_n k' \tag{57}$$

is associated in accordance with (39) with the limiting function as defined in (56), so that (see FIG. 8):

$$\hat{z}(n) = z'(n) - z'(n-1) + (k_n - k_{n-1})k' = \\ z'(n) - z'(n-1) + (k_n - k_{n-1})k' \quad (58)$$

Figure 14:
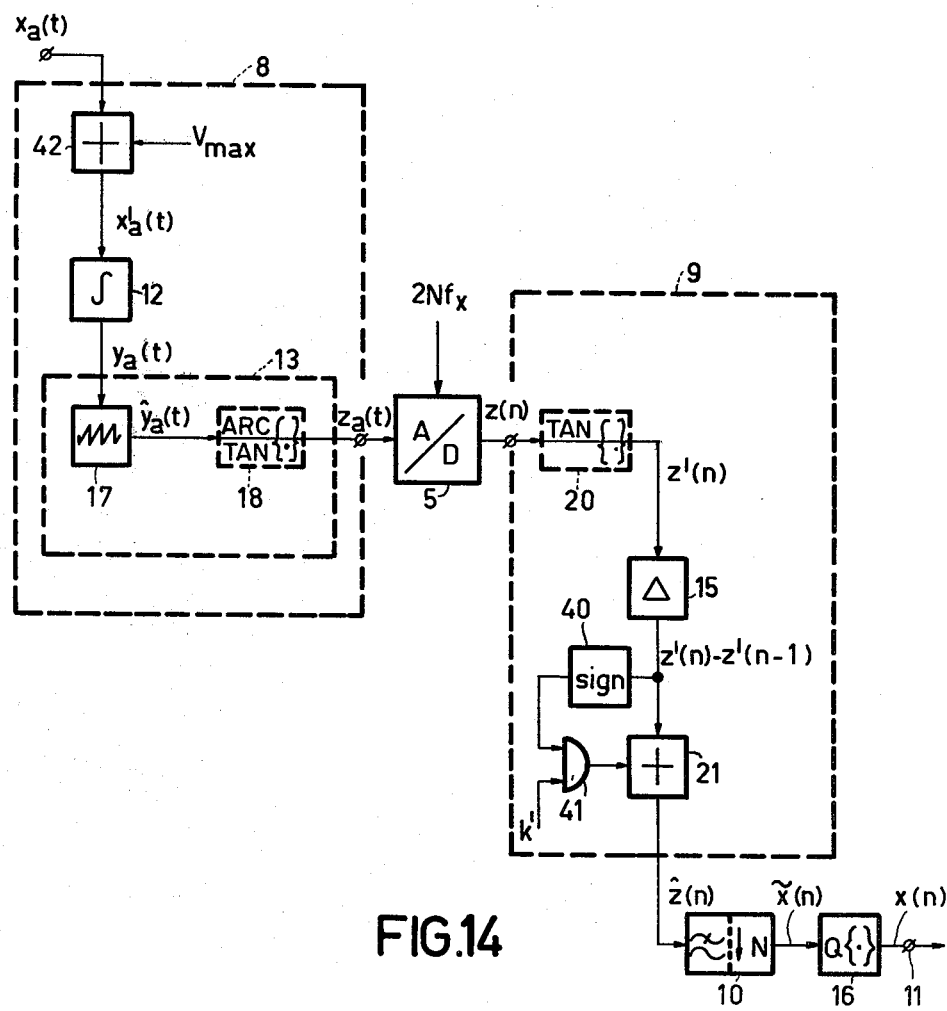
FIG. 14 shows a simplification of the A/D converter shown in FIG. 11.

FIG. 14 shows an embodiment based on the limiting function defined in (56) and the restoration function defined in (57). For this embodiment it is further assumed that the signal applied to the integrating network 12 is always positive, so that the expressions (44), (45) and (46), shown in paragraph E(3) are still valid. This arrangement, shown in FIG. 14, differs from the arrangement shown in FIG. 11 in the following respects:

1. Now the pre-processing arrangement 8 produces no numbers $k_n - k_{n-1}$ and the auxiliary limiter 18 is formed by a direct through-connection;

2. The post-processing arrangement 9 now comprises a polarity detector 40 which has its input connected to the output of the difference network 15 and its output to an input of the adder 21 through a gate circuit 41. The number k' is also applied to this gate circuit. Each time $z'(n) - z'(n-1)$ is positive, the gate circuit 41 produces the number zero, so that $\hat{z}(n) = z'(n) - z'(n-1)$. However, each time $z'(n) - z'(n-1)$ is negative, the gate circuit 41 produces the number k', so that $\hat{z}(n) = z'(n) - z'(n-1) + k'$. The auxiliary restorer 20 is now also formed by a direct through-connection.

3. To ensure that for any random input signal $x_a(t)$ for which it holds that $-V_{max} < x_a(t) < +V_{max}$, the signal applied to the integrating network 12 is always positive, the pre-processing arrangement 8 comprises an adding device 42 to which the signal $x_a(t)$ is applied as well as a constant signal of the value $V_{max}$. So a signal $x_a'(t)$ which is always positive and for which it holds that:

$$X_a'(t) = x_a(t) + V_{max}$$

occurs as the output of the adding device 42.

(5) The auxiliary limiter 17

Figure 15:
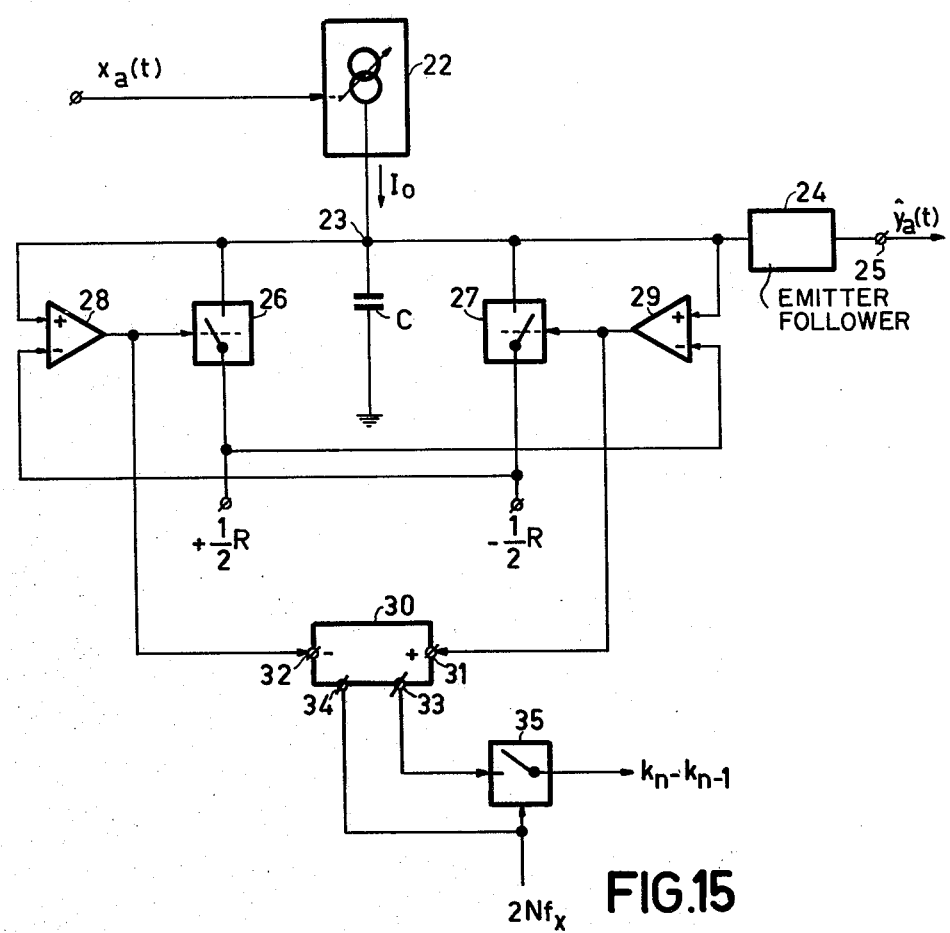
FIG. 15 shows in greater detail an embodiment of the cascade arrangement formed by the integrating network and the amplitude-limiting device with linear periodical limiting function.

The circuit shown schematically in FIG. 15 can be used for generating the signal $\hat{y}_a(t)$ and the number $k_n - k_{n-1}$. In this circuit the functions of the integrating network 12 and that of the auxiliary limiter 17 are combined. This circuit further comprises a controled current source circuit 22 to which the input signal $x_a(t)$ is applied as the control signal. This current source circuit produces a current $I_o$ whose magnitude is equal to the absolute value of $x_a(t)$ and whose direction is determined by the polarity of $x_a(t)$. The current $I_o$ produced when $x_a(t)$ is positive will be denoted the charging current whereas the current $I_o$ produced when $x_a(t)$ is negative will be denoted the discharging current. This current $I_o$ is applied to a capacitor C arranged between a point 23 of the circuit and ground. Via an emitter follower 24 the voltage across the capacitor C is now applied to the output 25 of this circuit at which the residual signal $\hat{y}_a(t)$ thus occurs.

To obtain the sawtooth shaped characteristic shown in FIG. 13, the point 23 is connected, through a switch 26 which is only symbolically shown, to a voltage of $+\frac{1}{2}R$ and, through a switch 27 which is also shown symbolically only to a voltage of $-\frac{1}{2}R$. In addition, this point 23 is connected to an input of a comparator 28 and to an input of a comparator 29. The voltage $-\frac{1}{2}R$ is applied to a second input of comparator 28 and the voltage $+\frac{1}{2}R$ is applied to a second input of comparator 29. As long as the voltage across the capacitor C is smaller than $-\frac{1}{2}R$, comparator 29 produces a logic "0". If, however, the voltage across the capacitor C becomes greater than $+\frac{1}{2}R$, comparator 29 produces a logic "1". The logic signals produced by the comparator 29 control the switch 27 thus that at the occurrence of a logic "0" this switch is in the open condition (position shown in the drawing), this switch being closed at the occurrence of a logic "1". When switch 27 closes the point 23 is connected to a voltage $-\frac{1}{2}R$ causing the capacitor C to discharge to this voltage $-\frac{1}{2}R$. As long as the voltage across the capacitor C is greater than $-\frac{1}{2}R$, comparator 28 produces a logic "0". If, however, the voltage across the capacitor C becomes smaller than $-\frac{1}{2}R$ comparator 28 produces a logic "1". The logic signals produced by comparator 28 control switch 26 thus that at the occurrence of a logic "0" this switch is in the opened condition (position shown in the drawing), the switch being closed at the occurrence of a logic "1". When switch 26 closes, the point 23 is connected to a voltage $+\frac{1}{2}R$ causing the capacitor C to be charged to this voltage $+\frac{1}{2}R$.

In addition, the output of comparator 29 is connected to the adding input 31 of an up/down-counter 30. Each time this comparator 29 supplies a logic "1" the counting position of this counter 30 is increased by one unit. The output of comparator 28 is further connected to the subtracting input 32 of counter 30. Each time comparator 28 supplies a logic "1" the counting position of counter 30 is decreased by one unit. In addition, this counter 30 comprises an output 33 and a resetting input 34. This resetting input 34 is supplied with the sampling pulses which are also applied to the auxiliary A/D converter 5, so that at the instants nT at which the A/D converter takes a sample of $z_a(t)$ this counter 30 is reset to the zero position. Just prior to this resetting action of this counter 30 the counting position is applied to the multiplier 19 shown in FIG. 11. All this is shown schematically in FIG. 15 by means of the switch 35, which is connected to the output 33 of the counter 30 and which is also controled by the sampling pulses. The desired number $k_n - k_{n-1}$ is obtained in this manner at the output of this switch 35.

(6) The preferred embodiment

In the arrangements shown in the FIGS. 11 and 14 the limiting device 17 can be implemented in the manner shown in FIG. 15. However, this circuit shown in FIG. 15 has the drawback that the capacitor C must be discharged and charged, respectively, in a very short period of time each time the voltage $+\frac{1}{2}R$ or the voltage $-\frac{1}{2}R$ has been reached. It is often simpler to realize a continuous limiting function instead of the discontinuous limiting function shown in FIG. 13. An example of a continuous limiting function is shown graphically in FIG. 16. As this Figure shows, the period of this continuous limiting function is now equal to $4V_{max}$ and a value of $y_a(t)$ is no longer unambiguously determined at a certain value of $\hat{y}_a(t)$ within a certain period. This ambiguity can be solved in the manner shown in FIG. 17.

The preferred embodiment of the arrangement according to the invention, shown in FIG. 17, corresponds largely to the arrangement shown in FIG. 14 but differs therefrom in the following respects.

1. A limiting function, whose variation is shown in FIG. 16 by means of a graph is now associated with the limiting device 17.

2. The output of this limiting device 17 is now also connected to the input of a differentiating network 43. The output of the network 43 is connected to the input of a quantizing device 44. The quantizing device 44 is controlled by the sampling pulses occurring with the frequency $f_s = 2Nf_x$ and it produces at each sampling instant either the number $+1$, or the number $-1$, depending on the fact whether the slope of the output signal of the limiting device is positive or negative at this sampling instant. The numbers thus produced are applied to a multiplier 46 through a delay device 45. The time delay of the delay device 45 is equal to the time the auxiliary A/D converter 5 requires for converting a sample $z_a(nT)$ of $z_a(t)$ into a number $z(n)$.

3. The above-mentioned multiplier 46 is arranged between the output of the resistor 20 and the difference network 15.

Figure 16:
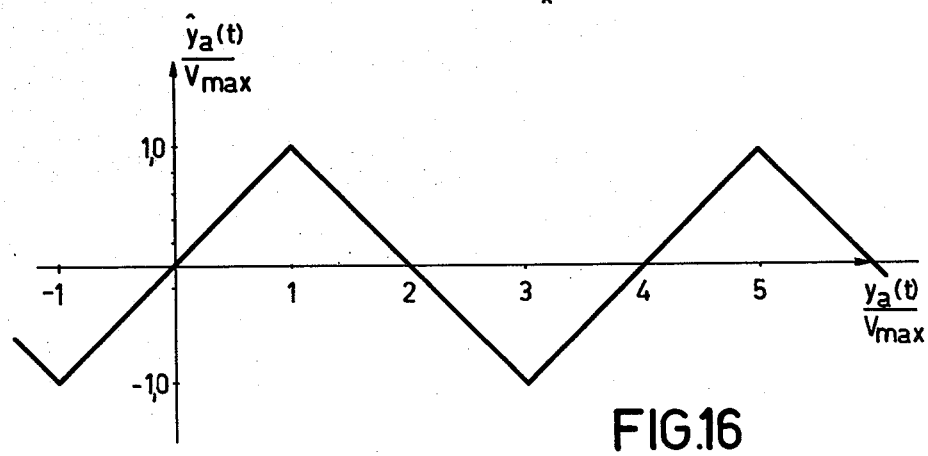
FIG. 16 shows a triangular limiting function for use in the A/D converter shown in FIG. 8.

As the absolute value of the slope of the limiting function, shown graphically in FIG. 16, is equal to unity, the limiting device 18 and the restoring device 20 can each again be constituted by a through-connection.

Figure 17:
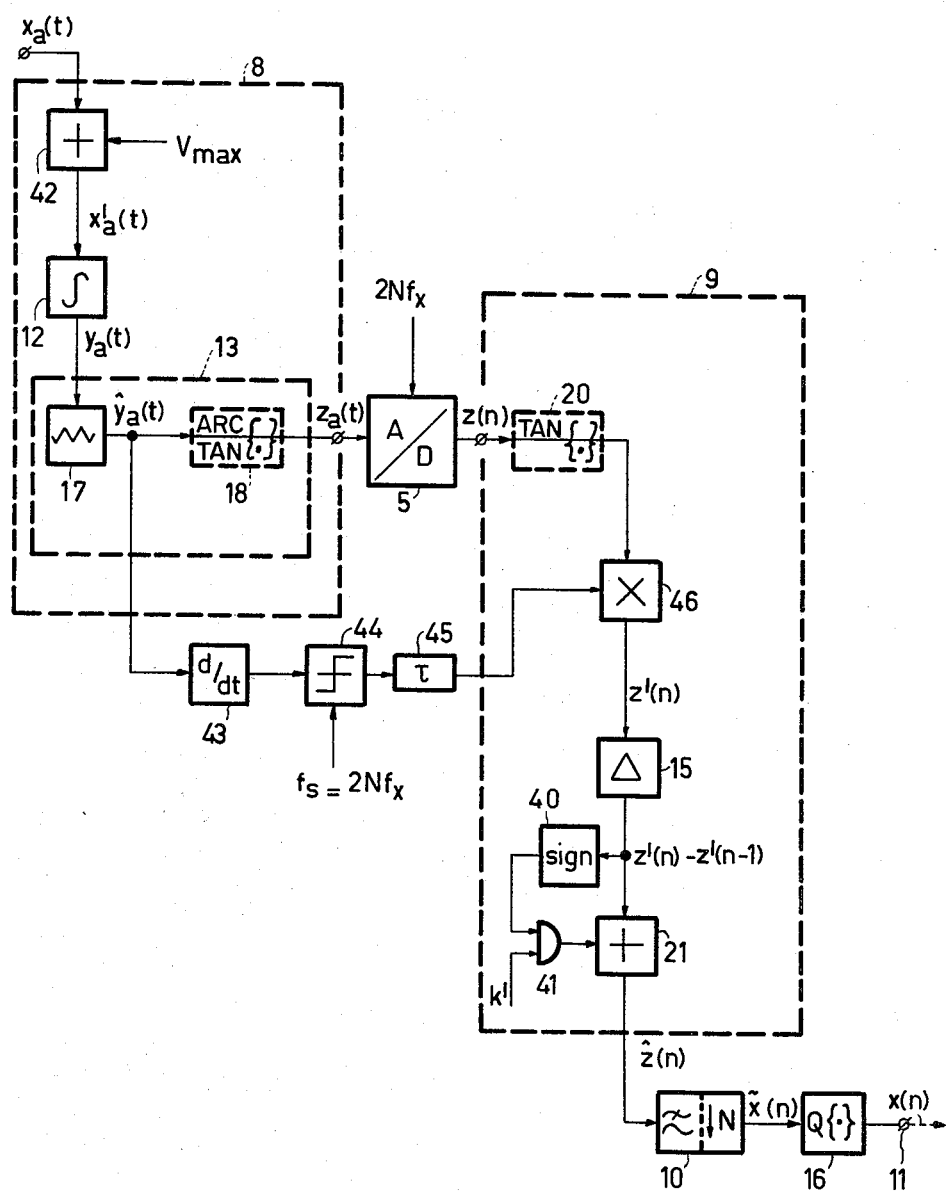
FIG. 17 shows the preferred embodiment of the A/D converter.
Figure 18:
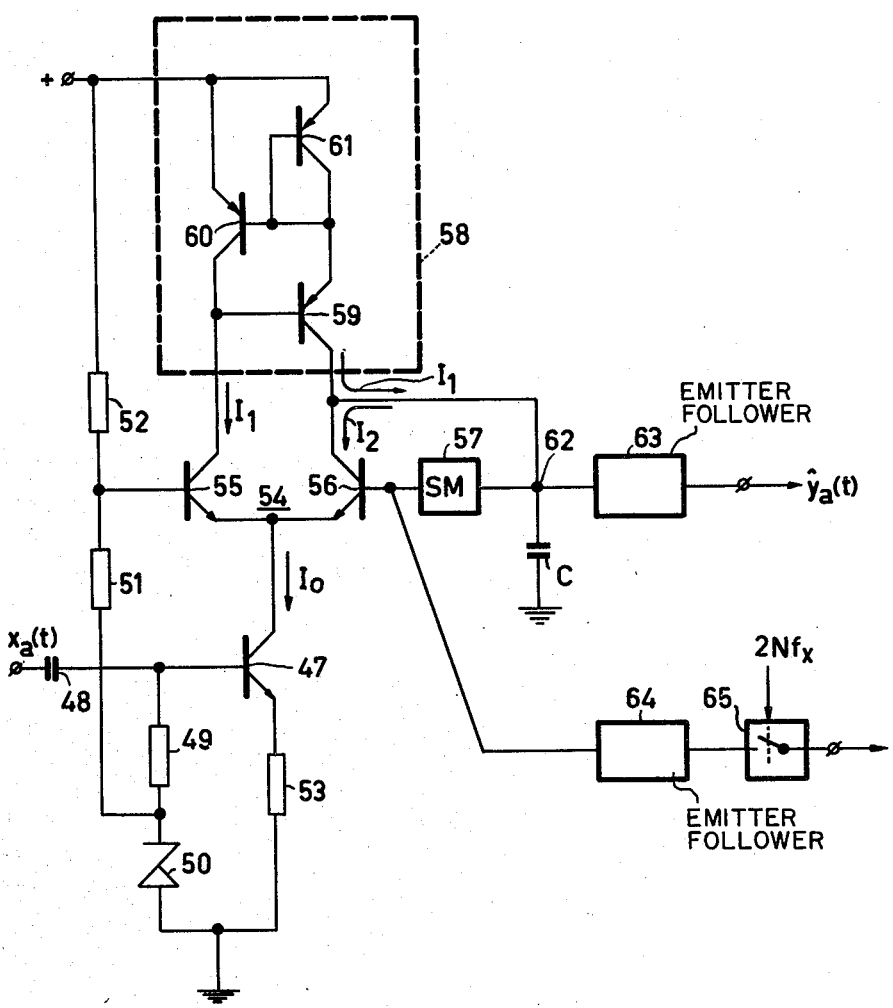
FIG. 18 shows in detail an embodiment of the pre-processing device for use in an A/D converter shown in FIG. 17.

FIG. 18 shows in greater detail an embodiment of a pre-processing arrangement as preferably used in the arrangement shown in FIG. 17 and by means of which the limiting function which is shown in the graph of FIG. 16 is realized. This pre-processing arrangement comprises a controled first current source circuit in the form of a npn-transistor 47 whose base, which functions as the control input, is coupled to the input to which the signal $x_a(t)$ is applied, of the pre-processing arrangement through a coupling capacitor 48. This base is also connected to ground potential through a resistor 49 and a Zener diode 50. The junction of the Zener diode 50 and the resistor 49 is connected to the positive terminal of a d.c. supply source through a series arrangement of resistors 51 and 52. The emitter of transistor 47 is also connected to ground potential, through a transistor 53. This first current source circuit produces an output current $I_o$ which is applied to a differential amplifier 54 as the supply current.

The differential amplifier 54 is formed by two npn-transistors 55 and 56 whose emitters are interconnected and connected to the collector of transistor 47. The base of transistor 56 is further connected to the common junction of the two resistors 51 and 52. The output signal of a Schmitt trigger circuit 57 is applied to the base of transistor 56. The collector of transistor 55 is connected to the input of a current-controlled second current source circuit 58 which has its output connected to the collector of transistor 56. This second current source circuit 58 is implemented as a so-called current mirror circuit and is formed more particularly in known manner, which manner is shown in the Figures, by two pnp- transistors 59 and 60 and a transistor 61, which is connected as a diode. The collector and the base of the transistors 60 and 59, respectively, are interconnected and connected to the collector of the transistor 55. The emitters of transistors 60 and 61 are connected to the positive terminal of the d.c. power supply. The output of this current mirror circuit 58 is formed by the collector of transistor 59, this collector being connected to the collector of transistor 56.

The pre-processing arrangement shown in FIG. 18 also comprises an integration capacitor C connected between a point 62 and ground potential. This point 62 is also connected to the collector of transistor 56 as well as to the input of the Schmitt trigger circuit 57 and to the input of an emitter-follower 63. The residual signal $\hat{y}_a(t)$ is produced at the output of this emitter-follower. The Schmitt trigger circuit has been set so that it produces a voltage which renders transistor 56 conductive if the voltage across the capacitor C becomes higher than $+V_{max}$. If, however, the voltage across the capacitor C becomes lower than $-V_{max}$ then the Schmitt trigger circuit produces an output voltage which cuts off transistor 56. When transistor 56 is cutoff, transistor 55 conducts so that a current $I_1$, which is applied as the charging current to the capacitor C, flows through the collector circuit of transistor 55 and, consequently, also in the collector circuit of transistor 59. When transistor 56 conducts, transistor 55 is cutoff. Now no current will flow in the collector circuits of the transistors 55 and 59. A current $I_2$ which is applied as the discharging current to the capacitor C, now flows in the collector circuit of transistor 56. The value of each of the currents $I_1$ and $I_2$ is determined by the value of $I_o$. In its turn, this current $I_o$ is proportional to the voltage at the base of transistor 47 and this voltage is equal to the input voltage $x_a(t)$ increased by a voltage $V_{50}$ across the Zener diode 50. When resistors 49, 51 and 52 are suitably dimensioned this voltage $V_{50}$ can be made equal to $V_{max}$, so that the base voltage of transistor 47 is equal to $x_a'(t) = x_a(t) + V_{max}$.

The pre-processing arrangement shown in FIG. 18 does not only produce the residual signal $\hat{y}_z(t)$ but also a signal which corresponds to the signal occurring at the output of the quantizing device 44 shown in FIG. 17. Namely, in the arrangement shown in FIG. 18 said signal occurs at the output of the Schmitt trigger circuit 57. This output is now connected to the input of the delay network 45 through an emitter-follower 64 and a sampling device 65. This sampling device 65 is again controlled by the sampling pulses.

(7) Final remarks

1. As mentioned earlier in this description a great number of other limiting functions are also applicable, besides the limiting function extensively described hereinbefore. As it was shown hereinbefore it is advantageous to demand that these limiting functions are periodical and that they are invertable within each period. In addition to the functions already described hereinbefore the function $$z_a(t) = V_{max} \sin\left( \frac{y_a(t)}{2V_{max}} \pi \right) \tag{59}$$

is a particularly interesting example of a limiting function. Assuming this function to represent the limiting function of the limiting device 13 in the pre-processing arrangement shown in FIG. 14 then it holds for the output signal $z_a(t)$ of this pre-processing arrangement more particularly that:

$$z_a(t) = V_{max} \sin\left( \frac{\pi}{2T}\left( t + \int_0^t \frac{x_a(\tau)}{V_{max}} d\tau \right) \right) \tag{60}$$

when $\pi/(2T) = \omega_0$, (60) being the mathematical representation of a frequency-modulated signal having carrier frequency $\omega_0/2\pi$ and the sweep $\omega_0/2\pi$. This means that the pre-processing arrangement can be in the form of a FM-modulator.

2. As stated in expression (23) z(n) is proportional to $x_a(nT-T/2)$. By using a sample- and hold-circuit in the pre-processing arrangement 8 it can be ensured that z(n) becomes proportional to $x_a(nT)$. In the arrangements shown in the FIGS. 8 and 11 the said sample-and hold circuit can be connected to the input of the integrating network 12 so that $x_a(t)$ is applied to this integrating network 12 through this circuit so that it then holds that:

$$\tilde{z}(n)V_{max} = x_a(nT) + r(n) - r(n-1)$$

In the arrangements shown in the FIGS. 14 and 17 the said sample and hold circuit can be included between the input of the arrangement and the input of the adding device 42, but also between the output of the adding device 42 and the input of the integrating network 12.

Figure 19:
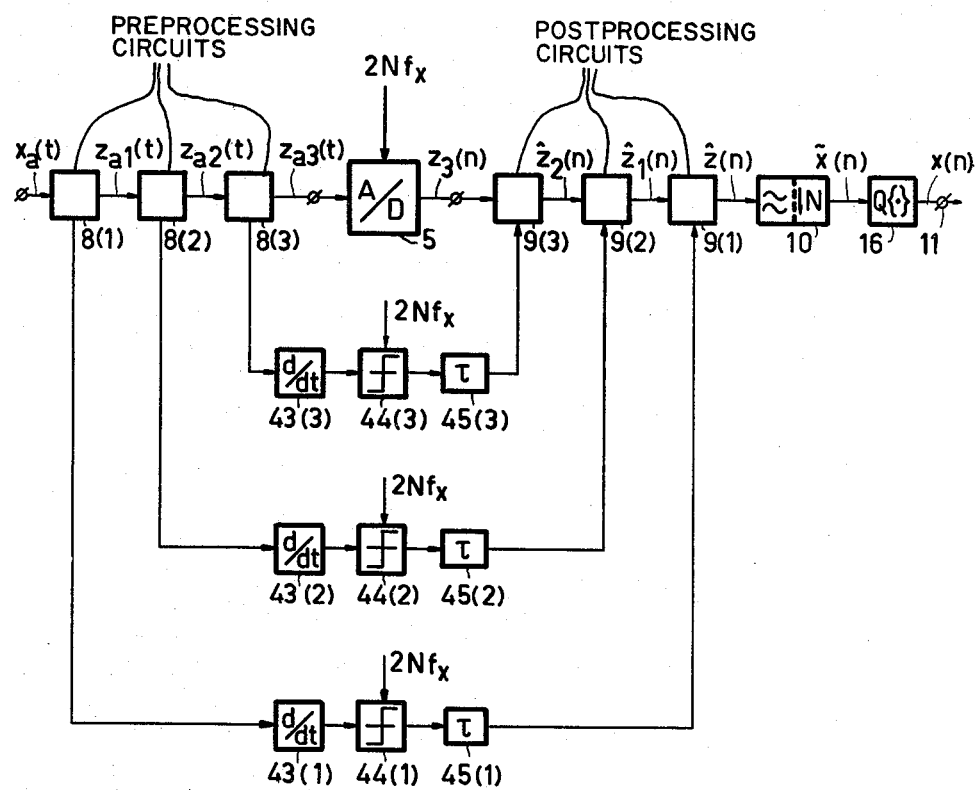
FIG. 19 shows a nested version of the A/D converter shown in FIG. 17.

3. The value of N required to obtain (b+a)-bit code words by means of the arrangement according to the invention, provided with a b-bit auxiliary A/D converter, can be derived from FIG. 10. For example, for a =4 it holds that N must be taken equal to 9.2. This means that if x(n) must be a sixteen-bit code word that then a 12-bit auxiliary A/D converter must be used which, however, can still be relatively expensive. It is, however, possible to obtain the 16-bit code words at the same value of N by using an auxiliary A/D converter producing code words which comprise less than 12 bits. This can be achieved by means of any one of the arrangements described hereinbefore, namely by "nesting" such an arrangement in known manner. Nesting, for example, the arrangement shown in FIG. 17 furnishes the arrangement shown in FIG. 19. In this arrangement of FIG. 19 the analog signal $x_a(t)$ is applied to the auxiliary A/D converter 5 through a cascade arrangement of M pre-processing arrangements 8(1), 8(2) ... 8(M). The code words $z_3(n)$ produced by this auxiliary A/D converter 5 are applied through a cascade arrangement of M-post-processing arrangements 9(1), 9(2), ... 9(M) to the decimating filter 10. In the arrangement shown in FIG. 19, M is equal to three. Each of the three pre-processing arrangements 8(1), 8(2) and 8(3) is implemented as the pre-processing arrangements shown in FIG. 17 and it is assumed that they are each provided, in accordance with final remark 2, with a sample and hold circuit. Also each of the three post-processing arrangements 9(1), 9(2) and 9(3) is implemented in the same manner as the post-processing arrangements shown in FIG. 17.

What is claimed is:

1. An analog-to-digital converter for converting an analog signal whose frequency spectrum is located in a certain signal frequency band, into a sequence of code words each comprising b+a bits, characterized in that this analog-to-digital converter comprises:
   (a) an input for receiving said analog signal;
   (b) integration and amplitude-limiting means for generating an auxiliary signal which is an amplitude-limited version of the integrated signal applied to these means;
   (c) means for coupling the input of the integration and amplitude-limiting means to said analog signal input;
   (d) an auxiliary analog-to-digital converter to which said auxiliary signal is applied and which is arranged for converting this auxiliary signal into a sequence of code words each comprising b bits; sampling pulses which occur with a sampling frequency greater than the Nyquist sampling frequency of the analog signal being applied to this auxiliary analog-to-digital converter;
   (e) a cascade arrangement of a digital difference network and digital amplitude-restoration means, the cascade arrangement being connected to the output of the auxiliary analog-to-digital converter;
   (f) a digital filter coupled to the output of the cascade arrangement and arranged for suppressing the frequency components located outside the signal frequency band and for supplying said (b+a)-bit code words.

2. An analog-to-digital converter as claimed in claim 1, characterized in that the function describing the relation between the auxiliary signal produced by the integration and amplitude-limiting means and the integrated value of the signal applied to these means is a periodical function.

3. An analog-to-digital converter as claimed in claim 1, characterized in that said amplitude-restoration means comprise an adder device which has its first input connected to the output of the difference network and which has its output coupled to the input of the digital filter.

4. An analog-to-digital converter as claimed in claim 3, characterized in that the output of the difference network is also connected to a polarity detector circuit controlling a switching device through which a first or a second reference number is applied to a second input of the adder device in dependence upon the polarity of the numbers produced by the difference network.

5. An analog-to-digital converter as claimed in claim 1, characterized in that said coupling means comprise an adding device to which a constant reference signal is applied.

6. An analog-to-digital converter as claimed in claim 1, characterized in that said digital filter is constituted by a decimation filter.

* * * * *